United States Patent
Ren et al.

(10) Patent No.: US 8,822,348 B2
(45) Date of Patent: Sep. 2, 2014

(54) DUMMY WAFER STRUCTURE AND METHOD OF FORMING THE SAME

(71) Applicant: Shanghai Huali Microelectronics Corporation, Shanghai (CN)

(72) Inventors: Chuan Ren, Shanghai (CN); Zhi Wang, Shanghai (CN); HsuSheng Chang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 42 days.

(21) Appl. No.: 13/730,576

(22) Filed: Dec. 28, 2012

(65) Prior Publication Data

US 2014/0077343 A1    Mar. 20, 2014

(30) Foreign Application Priority Data

Sep. 19, 2012   (CN) .......................... 2012 1 0352952

(51) Int. Cl.
*H01L 21/31* (2006.01)
*H01L 21/3205* (2006.01)
*H01L 21/02* (2006.01)
*H01L 29/06* (2006.01)

(52) U.S. Cl.
CPC ........ *H01L 29/0603* (2013.01); *H01L 21/3205* (2013.01); *H01L 21/022* (2013.01)
USPC .......................................... 438/762; 257/640

(58) Field of Classification Search
USPC .......... 257/630, 640, 632, 649, E23.141, 204,
257/209, E21.002, E21.023, E21.614,
257/E27.108, E21.529, E21.536, E21.54,
257/E21.575, E21.598, E21.602, E21.606,
257/E21.705, E23.011, E23.101; 438/488,
438/684, 287, 400, 401, 460, 463, 465, 513,
438/586, 587, 786, 107, 113, 118, 129, 14,
438/142, 151, 155, 158, 17, 197, 27, 28,
438/299, 300, 301, 303, 396, 427, 455, 458,
438/471, 478, 5, 565, 612, 64, 653, 657,
438/667, 674, 689, 692, 696, 703, 719, 128,
438/199, 4, 795, 758–763
See application file for complete search history.

(56) References Cited

U.S. PATENT DOCUMENTS

2005/0248004 A1* 11/2005 Chang et al. .................. 257/632

* cited by examiner

*Primary Examiner* — Julio J Maldonado
*Assistant Examiner* — Robert Bachner
(74) *Attorney, Agent, or Firm* — Muncyh, Geissler, Olds & Lowe, P.C.

(57) ABSTRACT

A dummy wafer structure and a method of forming the same are disclosed. The dummy wafer structure includes: a silicon substrate; a silicon nitride layer over the silicon substrate; and a silicon dioxide layer over the silicon nitride layer. The method includes: a first step of forming a silicon nitride layer over a silicon substrate so as to form a silicon-silicon nitride structure; and a second step of forming a silicon dioxide layer over the silicon-silicon nitride structure obtained in the first step so as to form a silicon-silicon nitride-silicon dioxide structure. Dummy wafers with this special structure are able to avoid deposition rate inconsistency in a polysilicon deposition process and are capable of avoiding conventional dummy wafers' adverse effect on deposit layer thicknesses of process wafers and hence providing the process wafers with deposit layers having a high inter-wafer uniformity.

6 Claims, 2 Drawing Sheets

DUMMY WAFER STRUCTURE AND METHOD OF FORMING THE SAME

CROSS-REFERENCES TO RELATED APPLICATIONS

This application claims the priority of Chinese patent application number 201210352952.0, filed on Sep. 19, 2012, the entire contents of which are incorporated herein by reference.

TECHNICAL FIELD

The present invention relates to semiconductor fabrication processes, and more particularly, to a dummy wafer structure and a method of forming the same.

BACKGROUND

In the existing semiconductor fabrication processes, dummy wafers are used in furnace processes to block or stratify gas flows and to uniform the temperature distribution within a furnace so as to make reactant gases carried by the gas flows evenly heated and evenly contact with the wafers processed and hence the reactant gases react chemically or physically with the wafers processed to deposit or grow a thin film on the wafers processed.

Furnace wafers used in a low-pressure chemical vapor deposition (LPCVD) furnace process for polysilicon deposition generally have a silicon-silicon nitride structure, as shown in FIG. 1, consisting of a silicon substrate 1 and a silicon nitride layer 2 with a thickness of 50 nm to 200 nm over the silicon substrate 1. Such structure enables the underlying silicon substrate 1 to be protected by the silicon nitride layer 2 from being eroded by an acidic solution during a cleaning process performed to the dummy wafers after they are retrieved, thus extending life spans of the dummy wafers.

Nevertheless, during the deposition of gate polysilicon of a metal-oxide-semiconductor (MOS) device, process wafers disposed in the furnace always have a silicon dioxide layer formed thereon, as a gate polysilicon layer is generally formed on a silicon dioxide dielectric layer. As a result, the process wafers and the dummy wafers have different materials on their surfaces with silicon dioxide on surface of the process wafers and silicon nitride on surface of the dummy wafers.

As different materials have different absorption rates against reactant gases introduced in the furnace process, it will lead to different deposition rates of reactant gases deposited on surface of the different materials. Therefore, after a certain amount of the reactant gases are introduced in, a greater amount of gas will be consumed on surface of the material having a higher deposition rate while a smaller amount of gas will be consumed on surface of the material having a lower deposition rate, which will affect the thickness of the film deposited over surface of the process wafers.

Therefore, in a polysilicon deposition process, when conventional dummy wafers with a silicon nitride layer formed thereon are disposed in the same furnace with process wafers, polysilicon layers with a thickness deviating from the desired value will be deposited on process wafers due to an absorption rate difference between silicon nitride and silicon dioxide against the reactant gases.

Thus, there is a need to improve the structure of the conventional dummy wafers to avoid their adverse effect on thicknesses of deposit layers of process wafers in a furnace process.

SUMMARY OF THE INVENTION

The present invention overcomes the aforementioned drawback by presenting a dummy wafer structure and a method of forming the same which can avoid the adverse effect of the conventional dummy wafers on thicknesses of deposit layers of process wafers in a dummy process.

To achieve the above objective, according to a first aspect of the present invention, there is provided a dummy wafer structure, including: a silicon substrate; a silicon nitride layer over the silicon substrate; and a silicon dioxide layer over the silicon nitride layer.

Preferably, the dummy wafer structure is for use in a polysilicon deposition process.

Preferably, the silicon nitride layer has a thickness within the range of 50 Å to 200 Å.

Preferably, the silicon dioxide layer has a thickness within the range of 10 Å to 50 Å.

According to a second aspect of the present invention, there is provided a method of forming the dummy wafer structure, the method including:

a first step of forming a silicon nitride layer over a silicon substrate so as to form a silicon-silicon nitride structure; and a second step of forming a silicon dioxide layer over the silicon-silicon nitride structure obtained in the first step so as to form a silicon-silicon nitride-silicon dioxide structure.

Preferably, in the first step, the silicon substrate is disposed in a furnace for depositing silicon nitride to deposit a silicon nitride layer with a thickness of 50 Å to 200 Å over the silicon substrate so as to form the silicon-silicon nitride structure.

Preferably, in the second step, the silicon-silicon nitride structure obtained in the first step is disposed in a furnace for depositing silicon dioxide to deposit a silicon dioxide layer with a thickness of 10 Å to 50 Å over the silicon-silicon nitride structure so as to form the silicon-silicon nitride-silicon dioxide structure.

Preferably, in the first step, the silicon substrate is disposed in a low-pressure chemical-vapor deposition (LPCVD) furnace with a temperature of 650° C. to 780° C., a pressure of 0.1 Torr to 0.2 Torr, and a reaction gas of dichlorosilane and ammonia to form the silicon nitride layer with the thickness of 50 Å to 200 Å over the silicon substrate.

Preferably, in the second step, the silicon-silicon nitride structure is disposed in an LPCVD furnace with a temperature of 750° C. to 800° C., a pressure of 0.3 Torr to 0.5 Torr, and a reaction gas of dichlorosilane and nitrous oxide to form the silicon oxide layer with the thickness of 10 Å to 50 Å over the silicon-silicon nitride structure.

Preferably, in the second step, the silicon-silicon nitride structure is disposed in an LPCVD furnace with a temperature of 650° C. to 700° C., a pressure of 0.3 Torr to 0.4 Torr, and a reaction gas of tetraethyl orthosilicate to form the silicon oxide layer with the thickness of 10 Å to 50 Å over the silicon-silicon nitride structure.

Dummy wafers with this special structure according to the present invention are capable of avoiding conventional dummy wafers' adverse effect on deposit layer thicknesses of process wafers and hence providing the process wafers with deposit layers having a high inter-wafer uniformity, while still able to be retrieved by a conventional method. Dummy wafers with the structure according to the present invention are characterized in that they have a top layer made of the same material with that of process wafers by further including a silicon dioxide layer over a silicon-silicon nitride structure, and thus are able to avoid deposition rate inconsistency in a deposition process and provide process wafers with a better inter-wafer uniformity.

BRIEF DESCRIPTION OF THE DRAWINGS

A more thorough understanding of the present invention as well as an easier understanding of advantages and features according to the present invention will be attained by referring to a detailed description of the preferred embodiments provided below along with accompanying drawings.

Figure 1:
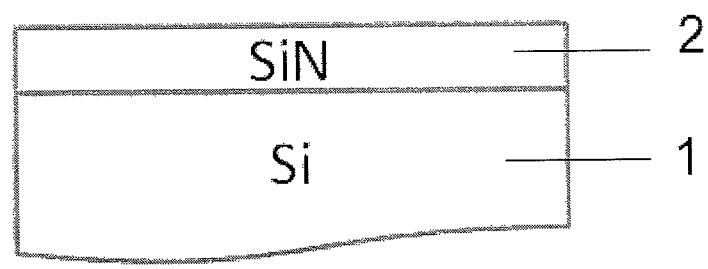
FIG. 1 schematically shows the structure of a dummy wafer according to the prior art.

Note that the accompanying drawings for showing structures may not be to scale, and are incorporated to depict the invention only. Therefore, the drawings should not be construed in any manner that they would be limiting to the scope of the invention. In the drawings, the same or similar reference numbers represent the same or similar elements.

DETAILED DESCRIPTION

Upon reading the following description of specific embodiments in conjunction with the accompanying drawing figures, the concepts of the present invention will be clearer and easier to be understood.

First Embodiment

Figure 2:
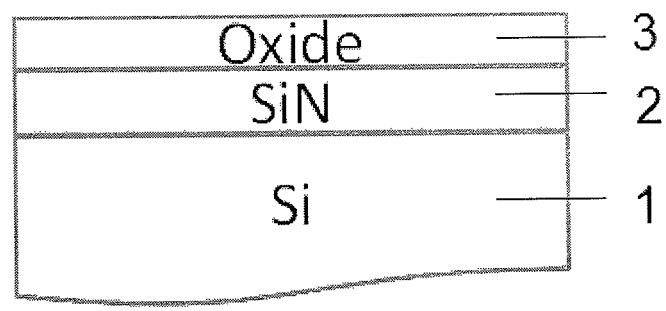
FIG. 2 schematically shows a dummy wafer structure constructed according to a first embodiment of the present invention.

FIG. 2 schematically shows a dummy wafer structure constructed according to a first embodiment of the present invention.

As shown in FIG. 2, the dummy wafer structure of this embodiment includes: a silicon substrate 1; a silicon nitride (SiN) layer 2 over the silicon substrate 1; and a silicon dioxide layer 3 over the silicon nitride layer 2.

Preferably, the silicon nitride layer 2 has a thickness within the range of 50 Å to 200 Å.

Preferably, the silicon dioxide layer 3 has a thickness within the range of 10 Å to 50 Å.

Moreover, the dummy wafer structure of this embodiment is very suitable to be used in polysilicon deposition processes.

When dummy wafers with such special structure that is formed by depositing silicon nitride on a silicon substrate and further depositing silicon dioxide on the silicon nitride is employed in a polysilicon deposition process, the adverse result that the deposit thickness of process wafers deviates from a target value caused by the use of conventional dummy wafers whose top layer is made of a different material from that of the process wafers can be avoided. Therefore, the inter-wafer uniformity of thicknesses of thin films deposited or grown on the process wafers can be significantly improved, thus improving the process capability index of the polysilicon deposition process.

According to the foregoing description, the dummy wafer structure constructed according to the first embodiment of the present invention at least has beneficial effects as follows.

Firstly, when dummy wafers with a silicon-silicon nitride-silicon dioxide structure according to the present invention are used in practical production, the adverse effect caused by different top layer materials between dummy wafers and process wafers can be avoided and the inter-wafer uniformity of process wafers can be improved. For example, it has been proved that when conventional dummy wafers with the silicon-silicon nitride structure are used in a deposition process targeted to deposit a 100 nm thick polysilicon layer, the thickness of deposited polysilicon films over the process wafers will be 1.5 nm to 2.0 nm thinner than the target thickness and the inter-wafer uniformity of them will be 0.6% to 1.0%; and in contrast, when dummy wafers with the structure according to the present invention are adopted, there will be no decrease in thickness of the deposited films from the target value and the inter-wafer uniformity of the films will be maintained under 0.3%.

Secondly, the employment of dummy wafers with the new structure will result in an increase of process capability and a satisfactory product quality.

Thirdly, the existing method for retrieving conventional dummy wafers is applicable to dummy wafers with the new structure without needing to be modified anyhow.

Second Embodiment

Figure 3:
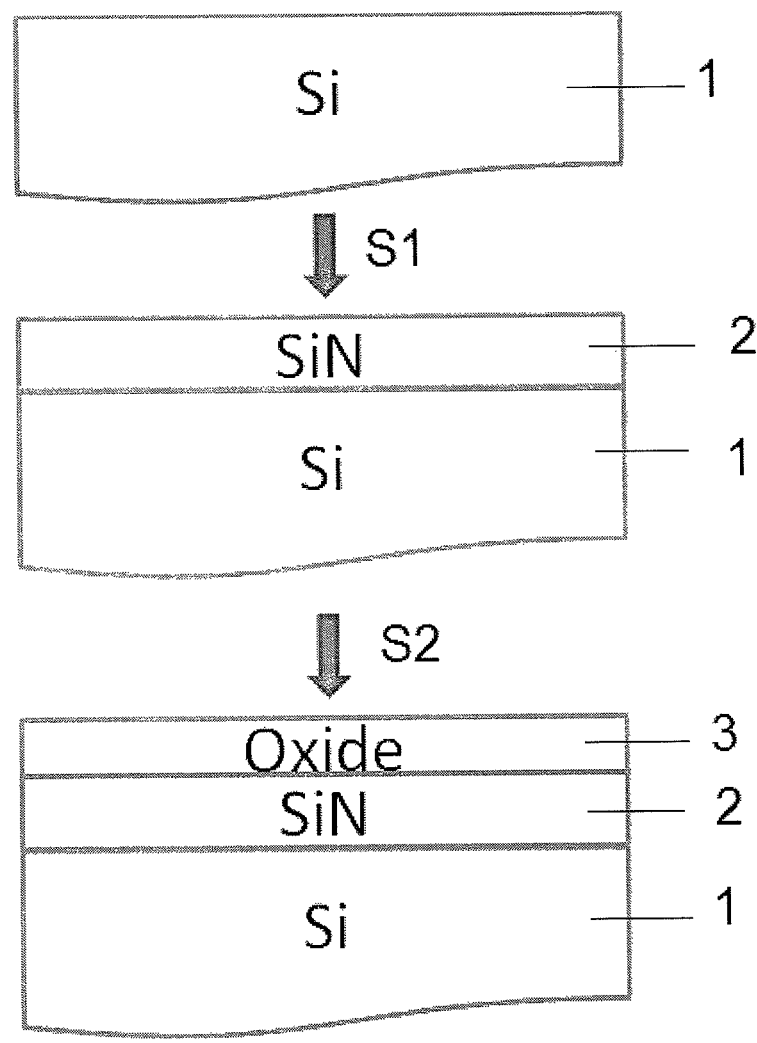
FIG. 3 schematically shows a method of forming a dummy wafer structure according to a second embodiment of the present invention.

FIG. 3 schematically shows a method of forming a dummy wafer structure according to a second embodiment of the present invention.

As shown in FIG. 3, the method of this embodiment includes:

a first step S1 of forming a silicon nitride layer 2 over a silicon substrate 1 so as to form a silicon-silicon nitride structure, which more specifically includes: for example, disposing the silicon substrate 1 in a furnace for depositing silicon nitride to deposit a silicon nitride layer 2 with a thickness of 50 Å to 200 Å over the silicon substrate 1 so as to form the silicon-silicon nitride structure; and a second step S2 of forming a silicon dioxide layer 3 over the silicon-silicon nitride structure obtained in the first step S1 so as to form a silicon-silicon nitride-silicon dioxide structure, which more specifically includes: for example, disposing the silicon-silicon nitride structure obtained in the first step S1 in a furnace for depositing silicon dioxide to deposit a silicon dioxide layer 3 with a thickness of 10 Å to 50 Å over the silicon-silicon nitride structure so as to form the silicon-silicon nitride-silicon dioxide structure.

After these steps, a dummy wafer with the silicon-silicon nitride-silicon dioxide structure may be disposed together with process wafers in a furnace for depositing polysilicon to receive a deposition process.

Moreover, after the deposition process, the dummy wafers may be retrieved by using the same method for processing conventional dummy wafers without needing to make any modifications of it, because in the cleaning process, in addition to the polysilicon deposited over the dummy wafers which will be removed by an acidic solution for dummy wafer retrieve, the underlying silicon dioxide layer formed over the silicon nitride layer will also be removed by the solution.

Therefore, of the dummy wafer structure according to the present invention, the silicon nitride layer deposited in the first step S1 is able to protect the underlying silicon substrate from being eroded by the acidic solution, while the silicon dioxide layer deposited in the second step S2 is able to avoid the adverse effect on the thicknesses of deposited films over the process wafers.

More specifically, the first step S1 may include the steps of: disposing the silicon substrate 1 in a low-pressure chemical-vapor deposition (LPCVD) furnace; increasing the temperature in the LPCVD furnace to 650° C. to 780° C. and lowering the pressure there to 0.1 Torr to 0.2 Torr; introducing reactant gases, which are dichlorosilane (DCS, chemical molecular formula: $SiH_2Cl_2$) gas and ammonia ($NH_3$) gas, with a certain flow rate ratio into the furnace; and obtaining the silicon nitride layer (silicon nitride film) 2 with a thickness of 50 Å to 200 Å from the reaction between the reactant gases.

In the second step S2, the silicon-silicon nitride structure is further disposed in an LPCVD furnace and the silicon dioxide layer (silicon dioxide film) 3 is deposited on the silicon-silicon nitride structure, wherein the silicon dioxide layer 3 may be deposited by alternatively using the following methods (1) and (2). The method (1) includes the steps of: increasing the temperature in the LPCVD furnace to 750° C. to 800° C. and lowering the pressure there to 0.3 Torr to 0.5 Torr; introducing reactant gases, which are DCS gas (dichiorosilane, chemical formula: $SiH_2Cl_2$) and nitrous oxide ($N_2O$) gas (also called laughing gas), with a certain flow rate ratio into the furnace; and obtaining the silicon dioxide layer from the reaction between the reactant gases. The method (2) includes the steps of: increasing the temperature in the LPCVD dummy to 650° C. to 700° C. and lowering the pressure there to 0.3 Torr to 0.4 Torr; introducing a reactant gas, which is tetraethyl orthosilicate (TEOS, chemical molecular formula: $Si(OC_2H_5)_4$), with a certain flow rate into the furnace; and obtaining the silicon dioxide layer from the reaction of the reactant gas.

In addition, although the LPCVD processes are performed in furnace according to the foregoing description, it should be appreciated that the present invention is not limited to it, and the LPCVD processes may be alternatively performed to deposit silicon nitride or silicon dioxide in a single-wafer processing device.

It is noted that the terms "first", "second" and "third" in this specification are terms to distinguish different components, elements or steps described in this specification rather than terms to describe a logic, sequential, or any other relationships between these components, elements or steps. While this invention has been particularly shown and described with respect to foregoing preferred embodiments, it will be understood that they are not intended to limit the scope of the present invention in any way. Accordingly, those skilled in the art will appreciate that various alternative and equivalent embodiments can be made based on the disclosure. In addition, those skilled in the art can make various modifications and variations of the present invention without departing from the scope and spirit of the invention. Thus, it is intended that the present invention covers all such simple changes, equivalent variations and modifications provided they come within the scope of the present invention.

What is claimed is:

1. A method of forming dummy wafer structure, the method comprising:
    a first step of forming a silicon nitride layer over a silicon substrate so as to form a silicon-silicon nitride structure; and
    a second step of forming a silicon dioxide layer over the silicon-silicon nitride structure obtained in the first step so as to form a silicon-silicon nitride-silicon dioxide structure,
    wherein in the second step, the silicon-silicon nitride structure obtained in the first step is disposed in a low-pressure chemical-vapor deposition furnace with a temperature of 750° C. to 800° C., a pressure of 0.3 Torr to 0.5 Torr, and a reaction gas of dichlorosilane and nitrous oxide to deposit a silicon dioxide layer with a thickness of 10 Å to 50 Å over the silicon-silicon nitride structure so as to form the silicon-silicon nitride-silicon dioxide structure.

2. The method according to claim 1, wherein in the first step, the silicon substrate is disposed in a furnace for depositing silicon nitride to deposit a silicon nitride layer with a thickness of 50 Å to 200 Å over the silicon substrate so as to form the silicon-silicon nitride structure.

3. The method according to claim 2, wherein in the first step, the silicon substrate is disposed in a low-pressure chemical-vapor deposition furnace with a temperature of 650° C. to 780° C., a pressure of 0.1 Torr to 0.2 Torr, and a reaction gas of dichlorosilane and ammonia to form the silicon nitride layer with the thickness of 50 Å to 200 Å over the silicon substrate.

4. A method of forming dummy wafer structure, the method comprising:
    a first step of forming a silicon nitride layer over a silicon substrate so as to form a silicon-silicon nitride structure; and
    a second step of forming a silicon dioxide layer over the silicon-silicon nitride structure obtained in the first step so as to form a silicon-silicon nitride-silicon dioxide structure,
    wherein in the second step, the silicon-silicon nitride structure obtained in the first step is disposed in a low-pressure chemical-vapor deposition furnace with a temperature of 650° C. to 700° C., a pressure of 0.3 Torr to 0.4 Torr, and a reaction gas of tetraethyl orthosilicate to deposit a silicon dioxide layer with a thickness of 10 Å to 50 Å over the silicon-silicon nitride structure so as to form the silicon-silicon nitride-silicon dioxide structure.

5. The method according to claim 4, wherein in the first step, the silicon substrate is disposed in a furnace for depositing silicon nitride to deposit a silicon nitride layer with a thickness of 50 Å to 200 Å over the silicon substrate so as to form the silicon-silicon nitride structure.

6. The method according to claim 5, wherein in the first step, the silicon substrate is disposed in a low-pressure chemical-vapor deposition furnace with a temperature of 650° C. to 780° C., a pressure of 0.1 Torr to 0.2 Torr, and a reaction gas of dichlorosilane and ammonia to form the silicon nitride layer with the thickness of 50 Å to 200 Å over the silicon substrate.

* * * * *